United States Patent [19]
Libby et al.

[11] Patent Number: 6,039,000
[45] Date of Patent: Mar. 21, 2000

[54] FOCUSED PARTICLE BEAM SYSTEMS AND METHODS USING A TILT COLUMN

[75] Inventors: Charles J. Libby, Winchester; Billy W. Ward, Merrimac, both of Mass.

[73] Assignee: Micrion Corporation, Peabody, Mass.

[21] Appl. No.: 09/022,065

[22] Filed: Feb. 11, 1998

[51] Int. Cl.[7] .................................................. C23C 16/00
[52] U.S. Cl. ...................... 118/723 E; 250/309; 250/310; 250/398
[58] Field of Search .................................... 250/398, 310, 250/309; 438/712

[56] References Cited

U.S. PATENT DOCUMENTS

| | | | |
|---|---|---|---|
| 4,465,934 | 8/1984 | Westerberg et al. | 250/398 |
| 5,223,109 | 6/1993 | Itoh et al. | 204/192.34 |
| 5,541,411 | 7/1996 | Lindquist et al. | 250/309 |
| 5,576,542 | 11/1996 | Kaga | 250/310 |

FOREIGN PATENT DOCUMENTS

| | | | |
|---|---|---|---|
| 63-055958 | 3/1988 | Japan | H01L 21/88 |
| 0235725 | 2/1990 | Japan | H01L 21/302 |
| 04180621 | 6/1992 | Japan | H01L 21/302 |
| 04186831 | 7/1992 | Japan | H01L 21/302 |
| 06029251 | 2/1994 | Japan | 21/302 |
| 0778737 | 3/1995 | Japan | H01L 21/027 |

OTHER PUBLICATIONS

Esashi et. al., Laser Applications for Micromachining, AIP Conference Proceedings, vol. 369, Issue 1, pp. 1268–1273, May 1, 1996.

See the Remaining References provided in the appendix. Nonpatent references besides 1 are on request, Dec. 1998.

Skoog, D.A.; Leary, J.J.; Principles of Instrumental Analysis, 4th ed., 1992, pp. 115–118, Jan. 1992.

Sawaragi, H., et al., "Performance of a focused–ion–beam implanter with tilt–writing function," *Jpn J Appl Phys Part 1*, vol. 28, No. 10 (1989) pp. 2095–2098.

*Primary Examiner*—Thi Dang
*Assistant Examiner*—Rudy Zervigon
*Attorney, Agent, or Firm*—Lahive & Cockfield, LLP

[57] ABSTRACT

Particle beam systems and methods for interacting with a workpiece according to this invention include a work stage assembly and a first particle beam source. The work stage assembly is adapted a) for supporting a workpiece, b) for translating along a first axis, c) for translating along a second axis perpendicular to the first axis, and d) for rotating about a third axis perpendicular to both the first axis and the second axis. The work stage assembly has a work stage axis substantially parallel to the third axis. The first particle beam source for interacting with the workpiece is supported by the work stage assembly. The first particle beam source has a first particle beam axis. In one embodiment, the first particle beam source is oriented so that the first particle beam axis forms an angle with the third axis. In another embodiment, the first particle beam source is tiltable from a first position, with the first particle beam axis substantially parallel to the third axis, to a second position, with the first particle beam axis forming an angle with the third axis. Thus, the particle beam system can etch and image a vertical cross-section of the workpiece without offsetting the work stage axis from the third axis.

13 Claims, 6 Drawing Sheets

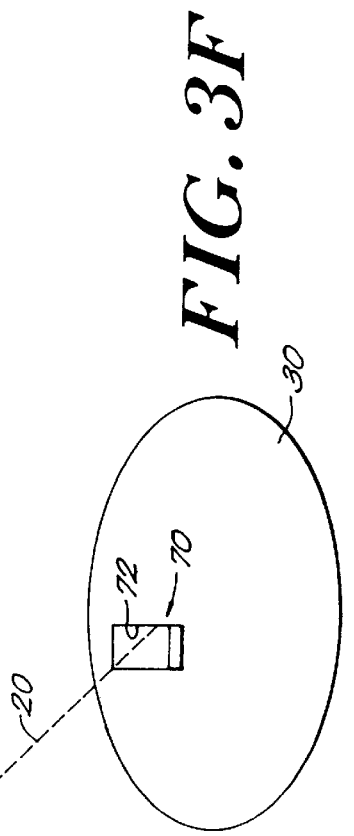
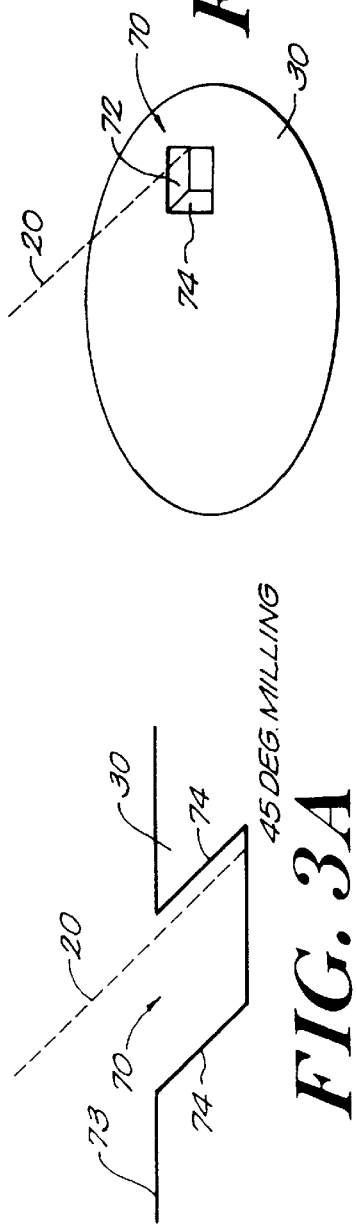
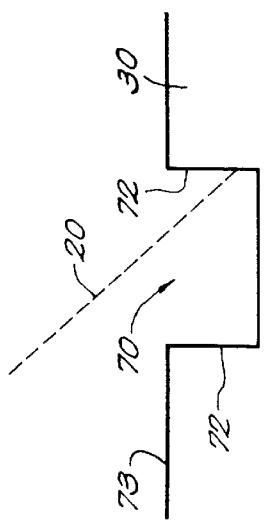
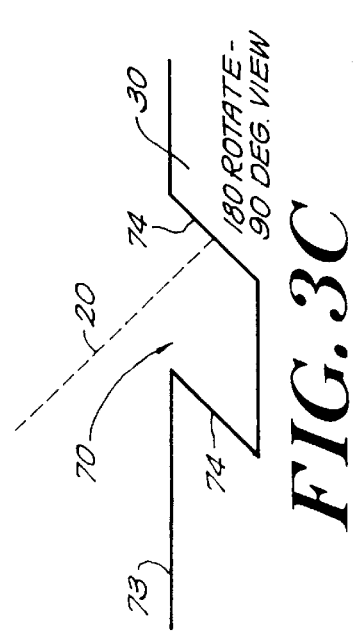

FOCUSED PARTICLE BEAM SYSTEMS AND METHODS USING A TILT COLUMN

BACKGROUND OF THE INVENTION

The present invention relates to focused particle beam systems and methods for processing a workpiece, e.g., etching and imaging a cross-section of a workpiece.

Present focused ion beam (FIB) systems typically include an ion beam column oriented normal to the workpiece and a tilting work stage. Such systems can include an electron column offset from the normal to the workpiece. To image a cross-section of a workpiece using an ion column, existing systems etch a cavity in the workpiece and tilt the stage so that the ion beam can impinge on a side wall of the cavity.

Existing FIB systems which incorporate a tilting stage experience several problems. A tilting work stage, which is large relative to many of the other components of a FIB system, causes the system to be relatively bulky. Such a large bulk is disadvantageous because cleanroom fabrication space is expensive. A tilting work stage also causes an FIB system to be unstable because a tilting work stage can make an FIB system susceptible to low frequency vibration and gravity sag, as discussed further below. Disadvantageously, the vibration of and the changing configuration of a tilting work stage can interfere with the performance of a system component, such as a laser interferometer. Laser interferometry can be used to assist in accurate monitoring of the position of a workpiece.

Low frequency vibration can occur when a massive object, such as a tilting stage, is supported by bearings and held steady with a mechanism that behaves like a spring. Low frequency vibration reduces resolution of a focused particle beam system by adding uncertainty in the determination of the location of the target point, i.e., where the ion beam interacts with the workpiece.

When a large work stage assembly is tilted, gravity can bend components of the work stage assembly and the workpiece. Such bending is termed gravity sag. It is difficult to monitor gravity sag. Thus, gravity sag can lead to inaccuracy in determining the positions of the work stage and of the workpiece. Such inaccuracy can reduce the resolution of a focused particle beam system.

Existing configurations of FIB systems restrict access to the workpiece by other elements, such as an optical microscope. Further, existing systems do not allow for optimization of the working distance of particular ion and electron columns. In existing configurations with a focused ion beam oriented normal to the workpiece and an electron beam offset with respect to the normal, one can not achieve working distances that optimize the characteristics, e.g., resolution and current density, of the ion and electron beams, because the work stage and the tip of the ion column and the tip of the electron column physically interfere with each other.

Accordingly, it is an object of the present invention to provide improved focused particle beam systems and methods for processing, e.g., etching and imaging a cross-section of a workpiece.

It is another object of the invention to reduce the footprint of a focused particle beam system.

It is another object of the invention to improve the stability of the work stage assembly of a focused particle beam system.

It is another object of the invention to improve the accuracy of a focused particle beam system.

It is another object of the invention to provide a focused particle beam system that allows for concurrent optimization of the working distances of a particle beam column and an electron beam column, the columns being oriented so that their target points are substantially coincident.

It is another object of the invention to provide a focused particle beam system that allows greater access to the workpiece by additional system elements such as an optical microscope.

Other objects of the invention will in part be obvious and in part will appear hereinafter.

SUMMARY OF THE INVENTION

One version of a particle beam system for interacting with a workpiece according to this invention, has a housing and an element for processing a workpiece contained in the housing. The processing element includes a work stage assembly and a first particle beam source. The work stage assembly is adapted a) for supporting the workpiece, b) for translating the workpiece along a first axis, c) for translating the workpiece along a second axis perpendicular to the first axis, and d) for rotating the workpiece about a third axis perpendicular to both the first axis and the second axis. The work stage assembly has a work stage axis substantially parallel to the third axis.

The first particle beam source interacts with the workpiece supported by the work stage assembly. The first particle beam source is located above the work stage assembly and has a first particle beam axis. The first particle beam source is oriented so that the first particle beam axis forms an acute angle with the third axis. Thus, the particle beam system can etch and image a vertical cross-section of the workpiece without offsetting the work stage axis from the third axis.

Workpieces or samples, such as wafers containing semiconductor devices, can contain features or structures having aspect ratios of 15:1. Thus, when cross-sectioning and imaging the cross-section of a workpiece containing such features or structures, the cross-section should be sufficiently vertical such that an individual feature's aspect ratio is accurately reflected in the cross-section.

Further, for the purposes of this application, one axis is defined as offset relative to another axis when the one axis forms an acute angle with respect to the other axis.

For illustration purposes only, and not to be taken in a limiting sense, the above-mentioned first and second axes can define a horizontal plane and the above-mentioned third axis can be a vertical axis. In this case, the work stage assembly can be adapted a) for supporting the workpiece in a horizontal plane, b) for translating the workpiece along a forward/backward direction, c) for translating the workpiece along a side to side or along a right/left direction, and d) for rotating the workpiece about the vertical axis. The work stage assembly has a work stage axis substantially parallel to the vertical axis. The first particle beam source has a first particle beam source axis oriented to form an acute angle with the vertical axis. Thus the particle beam system can etch and image a vertical cross-section of the workpiece without offsetting the work stage axis from the vertical axis.

There are several embodiments of this version of a focused particle beam system according to the invention. The first particle beam axis can form an angle of about forty-five degrees with the third axis. The system can further include a second particle beam source for interacting with the workpiece, located above the work stage assembly. The second particle beam source can have a second particle beam axis. In one embodiment, the second particle beam source is oriented so that the second particle beam axis is substantially parallel to the third axis. In another embodiment, the second particle beam source is oriented so that the second particle beam axis is offset relative to the third axis.

In another embodiment, the system can further include an electron beam source for interacting with the workpiece. The electron beam source is located above the work stage assembly and has an electron beam axis. The electron beam source is oriented so that the electron beam axis is selectively offset relative to the third axis.

There are still other embodiments of this version of a focused particle beam system according to the invention. The system can be configured so that the first particle beam axis and the electron beam axis each form an angle of about forty-five degrees with the third axis. Further, the system can be configured so that the first particle beam axis and the third axis form a first plane and the electron beam axis and the third axis form a second plane substantially perpendicular to the first plane. This system configuration is advantageous because the system can etch a vertical cross-section of a workpiece using the first focused particle beam source and can image the vertical cross-section using the electron beam without rotating the workpiece.

The system can be configured so that the work stage assembly includes a laser interferometer element for assisting in the accurate determination of the position of the workpiece. The laser interferometer can include a laser source, a beam splitter, at least one reference mirror, and at least one test mirror. The laser source directs laser radiation along a path in a first direction. The beam splitter is located in the path of the laser radiation from the laser source and transmits a first part of the laser radiation along the first direction, and reflects a second part of the laser radiation along a second direction. The reference mirror reflects back to the beam splitter the first transmitted part of the laser radiation. The test mirror reflects back to the beam splitter the second reflected part of the laser radiation and is located on said work stage assembly. Thus, the beam splitter combines the first transmitted part and the second reflected part of the laser radiation to form interference fringes that assist in the determination of the position of the workpiece.

The system can also be configured to include a gas injection source or an optical microscope or both. The gas injection source typically has a gas injection nozzle located above and in selected proximity to the workpiece. The optical microscope has an optical microscope axis and is oriented so that the optical microscope axis is substantially parallel to the third axis. One can use the optical microscope for so-called top-down wafer navigation.

The system can also be configured to include a work stage assembly that rotates more than twenty- five degrees, more preferably at least forty-five degrees and most preferably at least ninety degrees.

According to another version of the invention, the first particle beam source for interacting with the workpiece is tiltable from a first position, where the first particle beam axis is substantially parallel to the third axis, to a second position, where the first particle beam axis forms an angle with the third axis. With this arrangement, the particle beam system can etch and image a vertical cross-section of the workpiece without offsetting the work stage axis from the third axis.

A method for using a particle beam system to interact with a workpiece, according to one version of the invention, includes the steps of a) providing a particle beam system, b) placing the workpiece on a work stage assembly, and c) etching with the focused particle beam source a first cavity in the workpiece to expose at least a portion of at least one structure contained in a vertical cross-section of the workpiece.

The step of providing the particle beam system can include providing a work stage assembly adapted a) for supporting a workpiece, b) for translating the workpiece along a first axis, c) for translating the workpiece along a second axis perpendicular to the first axis, and d) for rotating the workpiece about a third axis perpendicular to both the first axis and the second axis. The work stage assembly has a work stage axis substantially parallel to the third axis.

The step of providing the particle beam system can also include providing a first particle beam source for interacting with the workpiece. The first particle beam source is located above the work stage assembly. The first particle beam source has a first particle beam axis. The first particle beam source is oriented so that the first particle beam axis forms an acute angle with the third axis.

Thus, the particle beam system can etch and image a vertical cross-section of the workpiece without offsetting the work stage axis from the third axis.

The step of providing a particle beam system can further include the step of providing an electron beam source for interacting with the workpiece. In this embodiment, the electron beam source is located above the work stage assembly and has an electron beam axis. The electron beam source is oriented so that the electron beam axis is selectively offset relative to the third axis.

The step of providing a particle beam system can further include the step of providing the electron beam source and the first particle beam source with the first particle beam axis and the electron beam axis each forming an angle of about forty-five degrees with the third axis. Further, the first particle beam axis and the third axis can form a first plane and the electron beam axis and the third axis can form a second plane such that the first plane is substantially perpendicular to the second plane.

The above method can further include the step of imaging the vertical cross-section of the workpiece using the electron beam source.

The above method can further include the step of etching a second cavity in selected proximity to the first cavity so as to produce a transmission electron microscope (TEM) sample wall or lamella separating the two cavities. The TEM lamella can have first and second opposed sides. The first side faces the first cavity and the second side faces the second cavity. The method can further include the steps of bombarding the second side of the TEM lamella with electrons from the electron gun, and monitoring the change in secondary particle emission from the lamella while etching the second cavity to monitor the thickness of the lamella.

The method described above can further include the step of rotating the workpiece ninety degrees about the third axis to expose the vertical cross section to the first particle beam source subsequent to the etching step. Subsequent to the rotating step, the focused particle beam system can image the vertical cross-section of the workpiece using the focused particle beam source.

Another version of a particle beam system for interacting with a workpiece according to the invention includes a work stage assembly for supporting a workpiece and for orienting the workpiece in a plane. The work stage assembly has a support element adapted for translating the workpiece along a first axis, and for translating the workpiece along a second axis perpendicular to the first axis. The support element has a first side and a second side, and a positioning assembly coupled to the first side of the support element and adapted for rotating the support element and the workpiece about a third axis perpendicular to both the first axis and the second axis, such that the workpiece can be seated on the second side of the support element and translated in a plane and rotated about the third axis normal to that plane.

The system further includes a first particle beam source for interacting with the workpiece. The workpiece is supported by the work stage assembly. The first particle beam source is located above the work stage assembly and has a first particle beam axis. The first particle beam source is tiltable from a first position with the first particle beam axis substantially parallel to the third axis, to a second position with the first particle beam axis forming an acute angle with the third axis. Thus, the particle beam system can etch and image a vertical cross-section of the workpiece without tilting the work stage axis relative to the third axis.

These and other features of the invention are more fully set forth with reference to the following detailed description and the accompanying drawings.

BRIEF DESCRIPTION OF THE DRAWINGS

FIG. 3A shows a cross sectional view of a workpiece undergoing 45 degree milling by the particle beam source of FIG. 1;

FIG. 3B is a perspective view from above of the workpiece of FIG. 3A;

FIG. 3C shows a cross sectional view of the workpiece of FIG. 3A after the stage has rotated the workpiece 180 degrees from its orientation in FIG. 3A;

FIG. 3D is a perspective view from above of the workpiece of FIG. 3C;

FIG. 3E shows a cross sectional view of a workpiece of FIG. 3A after the stage has rotated the workpiece 90 degrees for its orientation in FIG. 3A;

FIG. 3F is a perspective view from above of the workpiece of FIG. 3E;

DETAILED DESCRIPTION OF THE ILLUSTRATED EMBODIMENTS

Figure 1:
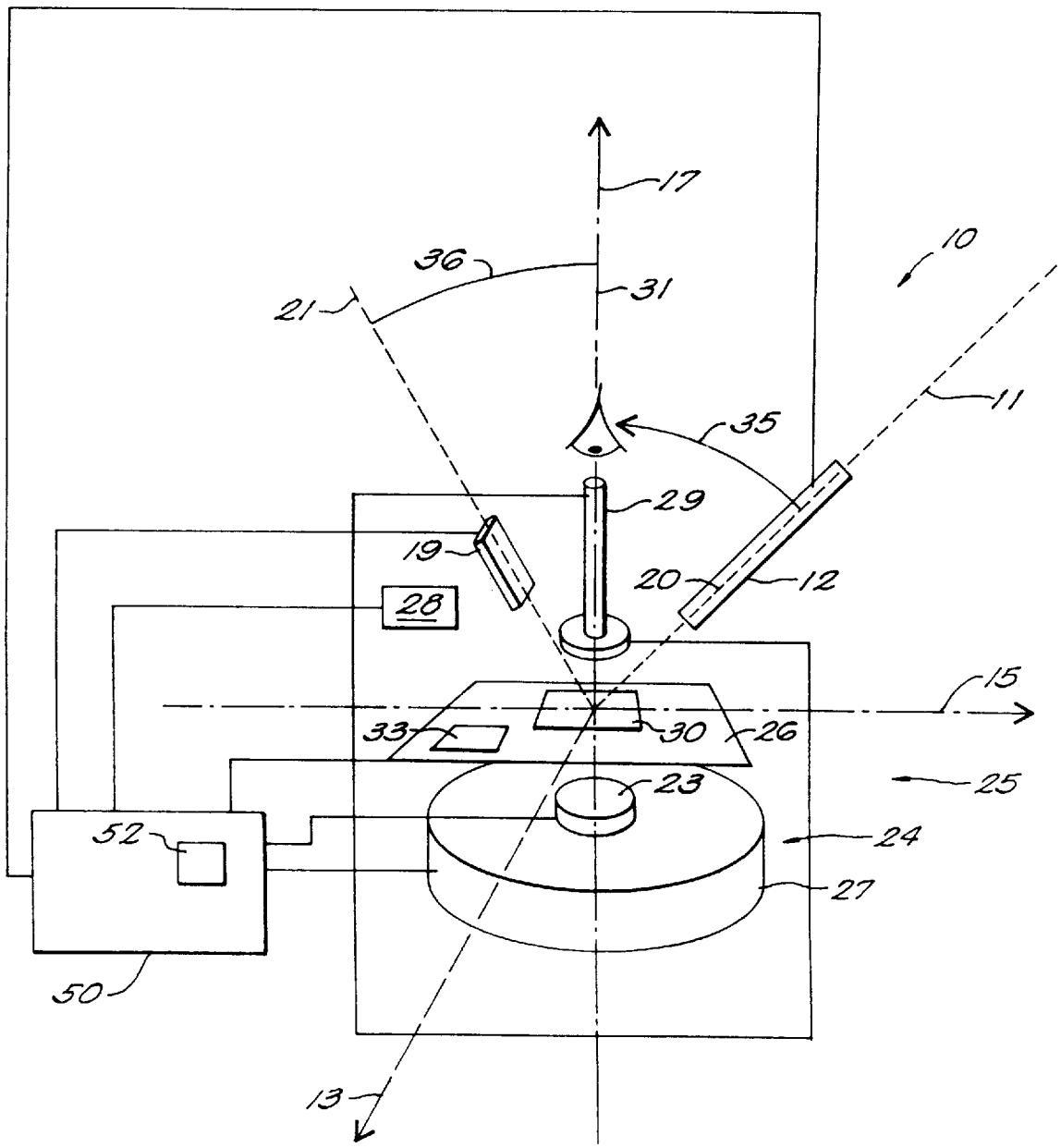
FIG. 1 is a perspective schematic view of one embodiment of a particle beam system according to the invention.

The system 10 illustrated in FIG. 1 with a tilted ion beam column 12 can etch a cavity in a sample to create a vertical cross-section and then image the vertical cross-section without tilting the work stage assembly 25. FIG. 1 depicts one embodiment of a focused particle beam system 10 according to the invention for interacting with a workpiece 30. The system 10 of FIG. 1 includes a tilted ion column 12, a vacuum chamber 22, and a work stage assembly 25. The system 10 provides a focused particle beam system that can precisely etch and image a cross-section of a sample or workpiece 30, e.g., a wafer containing semiconductor devices. The sample is seated within the vacuum chamber 22 and operated on by a particle beam generated by the tilted column 12 to create cross-sectional images. The images are used to analyze material defects found in the wafer, and can provide process engineers with timely data without removing the wafer from the production line.

Part of the ion column 12 is located above the vacuum chamber 22, and the vacuum chamber houses a work stage assembly 25, a sample or workpiece 30, and a secondary particle detector 28. The system further includes a user control station 50 having a processor 52 and an electron gun 31.

Performance of a Focused-Ion-Beam Implanter with Tilt-Writing Function by H. Sawaragi et al., Japanese Journal of Applied Physics, Part 1, 1989, Vol. 28, No. 10, Pages 2095–2098, incorporated herein by reference, describes an FIB implanter which has an ion optical system that can be tilted manually up to 7° without venting the workpiece chamber. This publication states that this system minimizes axial and planar channeling effects. To control the planar channeling effect, this system includes a wafer holder with a sample rotating function. The rotation angle of the wafer can be adjusted from 15° to 25° in 10 steps. However, there remains a need for a system that can etch and image a cross-section of a workpiece without tilting the work stage.

The illustrated work stage assembly includes a support element 26 and a support element rotation assembly 24. The support element 26 translates the workpiece 30 along a first axis 13, e.g., front and back in the horizontal plane, and along a second axis 15, e.g., left and right in the horizontal plane, perpendicular to the first axis 13. The rotation assembly rotates the support assembly around a third axis 17 perpendicular to both the first axis 13 and the second axis 15. The rotation assembly 24 can include a 360-degree manually adjustable rotation element 23 and a fast 180-degree hard stop stage rotation element 27. The operation of the ion column 12, work stage assembly 25, secondary particle detector 28, and optional electron gun 31 can be controlled by the control station 50.

The illustrated ion column 12 is tilted from vertical so that its axis 11 is offset from the third axis 17. In other words, the ion column axis 11 forms an acute angle 35 with the third axis 17 (the vertical axis in this case). In the illustrated embodiment, the angle 35 is forty-five degrees. The electron gun 31 can also be tilted from vertical so that its axis 21 forms an acute angle 36 with the third axis 17. In the illustrated embodiment, the electron gun-third axis angle 36 is forty-five degrees. Further, the ion column axis 11 forms a first vertical plane with the third axis 17 and the electron gun axis 21 forms a second vertical plane with the third axis 17. In a preferred embodiment, the first plane is substantially perpendicular to the second plane. This configuration is advantageous because the workpiece can be etched and a vertical cross-section can be imaged without rotating the workpiece about the third axis 17, and, in the case where the target points of the ion column 12 and of the electron gun 31 are substantially coincident, without translating the workpiece in the plane defined by the first axis 13 and the second axis 15.

Figure 7:
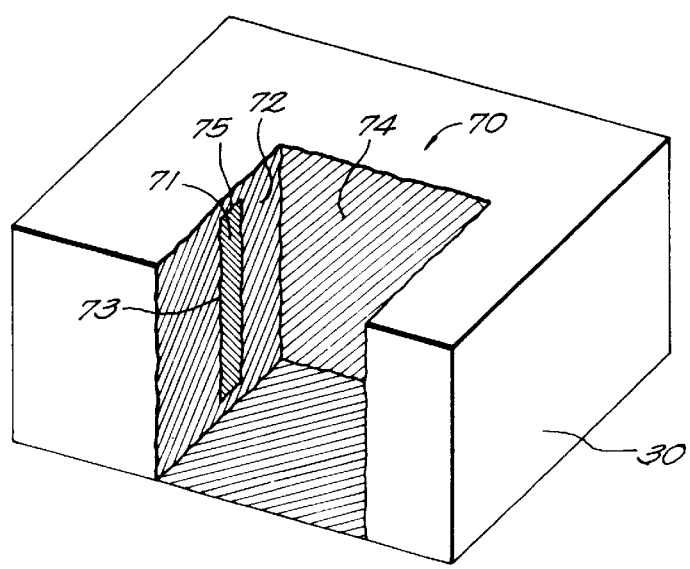
FIG. 7 is a perspective view of a cavity etched into the workpiece of FIG. 1.

Workpieces or samples, such as wafers containing semiconductor devices, can contain features having aspect ratios of 15:1. With reference to FIG. 7, at leas a portion 71 of a structure or feature is contained in a vertical cross-section 72 of the workpiece 30. The height 73 of the exposed portion 71 of the structure can be fifteen times the depth or breadth of the structure. If the cross-section is not sufficiently vertical, i.e., perpendicular to the plane defined by the workpiece, the structures of interest may not be accurately reflected in the cross-section. Thus, in order to accurately assess the dimensions of a structure, the cross-section should be sufficiently vertical such that an individual structure's aspect ratio is likely to be accurately reflected in the cross-section. The ability to etch and to image a cross-section of a workpiece without tilting the work stage is now described.

As noted above, the system 10 illustrated in FIG. 1 with a tilted ion beam column 12 can etch a cavity in a sample to create a vertical cross-section and then image the cross-section without tilting the work stage assembly 25. Etching and imaging a cross-section without tilting the work stage is accomplished using the system illustrated in FIG. 1 by rotating the workpiece 30 about the third axis 17, as illustrated in FIGS. 3A–3E and as described below. A focused ion beam system with a tilted ion beam column 12 etches a cavity 70 with slanted walls 74 and with vertical walls 72, as shown in FIGS. 3A and 3B. Vertical walls are walls that are substantially parallel to the third axis 17.

Subsequent to the etching of the cavity 70, the work stage assembly 25 rotates the workpiece 30 about the third axis 17. If the work stage assembly 25 rotates the workpiece 30 one hundred and eighty degrees, the focused ion beam impinges on the slanted wall 74 at substantially normal incidence, i.e., the beam 20 is perpendicular to the slanted wall 74, as shown in FIGS. 3C and 3D. However, if the work stage assembly 25 rotates the workpiece 30 ninety degrees about the third axis 17, as shown in FIGS. 3E and 3F, the beam 20 impinges on a vertical wall 72, i.e., a vertical cross-section of the workpiece. Thus, the tilted focused ion beam 20 can etch and image a vertical cross-section of a workpiece without tilting the work stage assembly 25 such the work stage assembly axis is offset from the third axis 17. In addition, if the electron column and the ion column are located in substantially perpendicular planes, as described above, the ion beam can etch the workpiece as shown in FIG. 3A, and without rotating the workpiece about the third axis 17, the electron beam can image the vertical wall 72 of the cavity 70. The systems and methods according to the invention provide many advantages as are now discussed.

Figure 5:
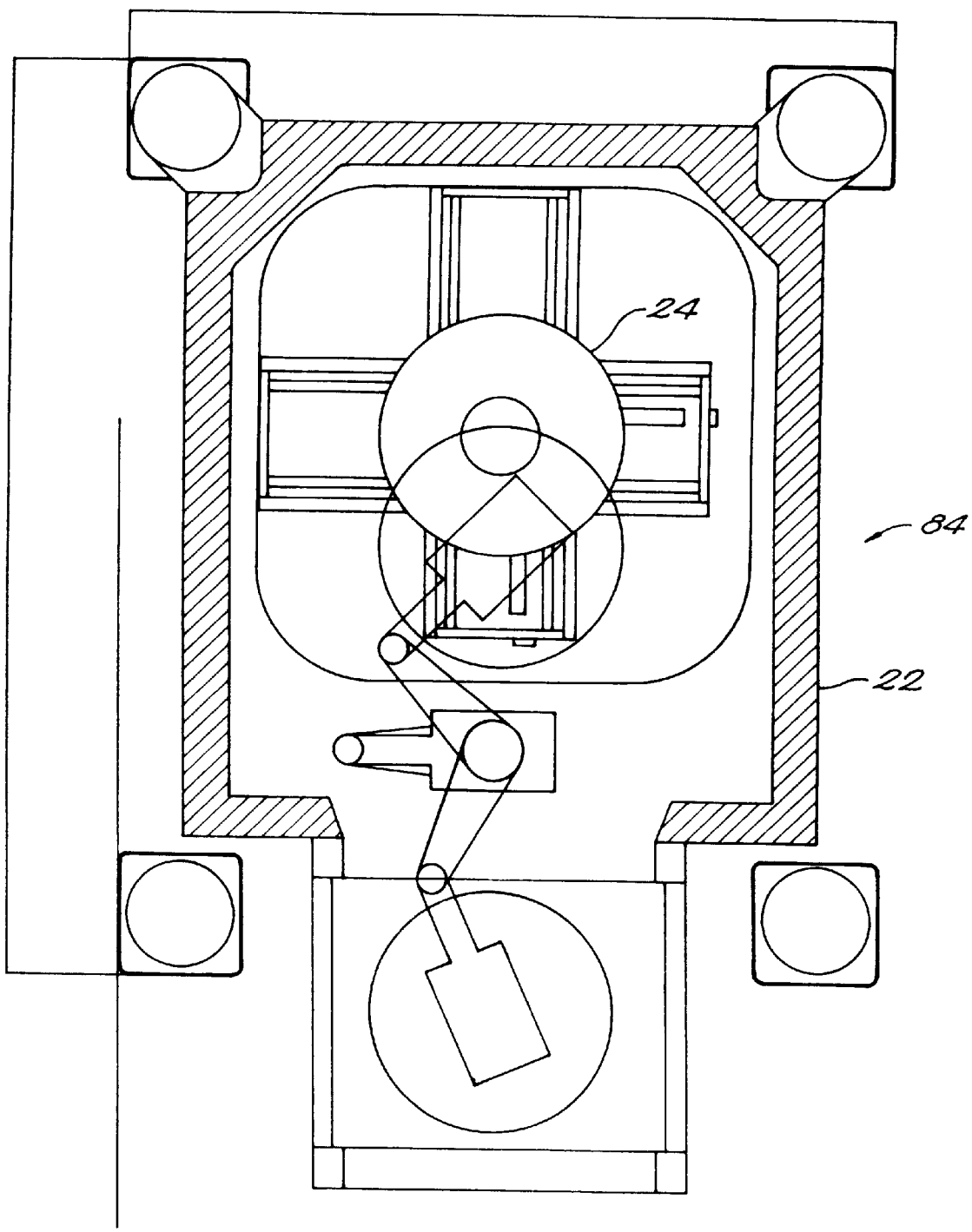
FIG. 5 is a schematic illustration of the area occupied by the particle beam system of FIG. 1.

The work stage assembly is much smaller when it does not include a tilt assembly. A smaller stage assembly results in a smaller footprint, shown schematically in FIG. 5, for the particle beam system. A smaller footprint results in considerable savings because cleanroom fabrication space is expensive.

Figure 4:
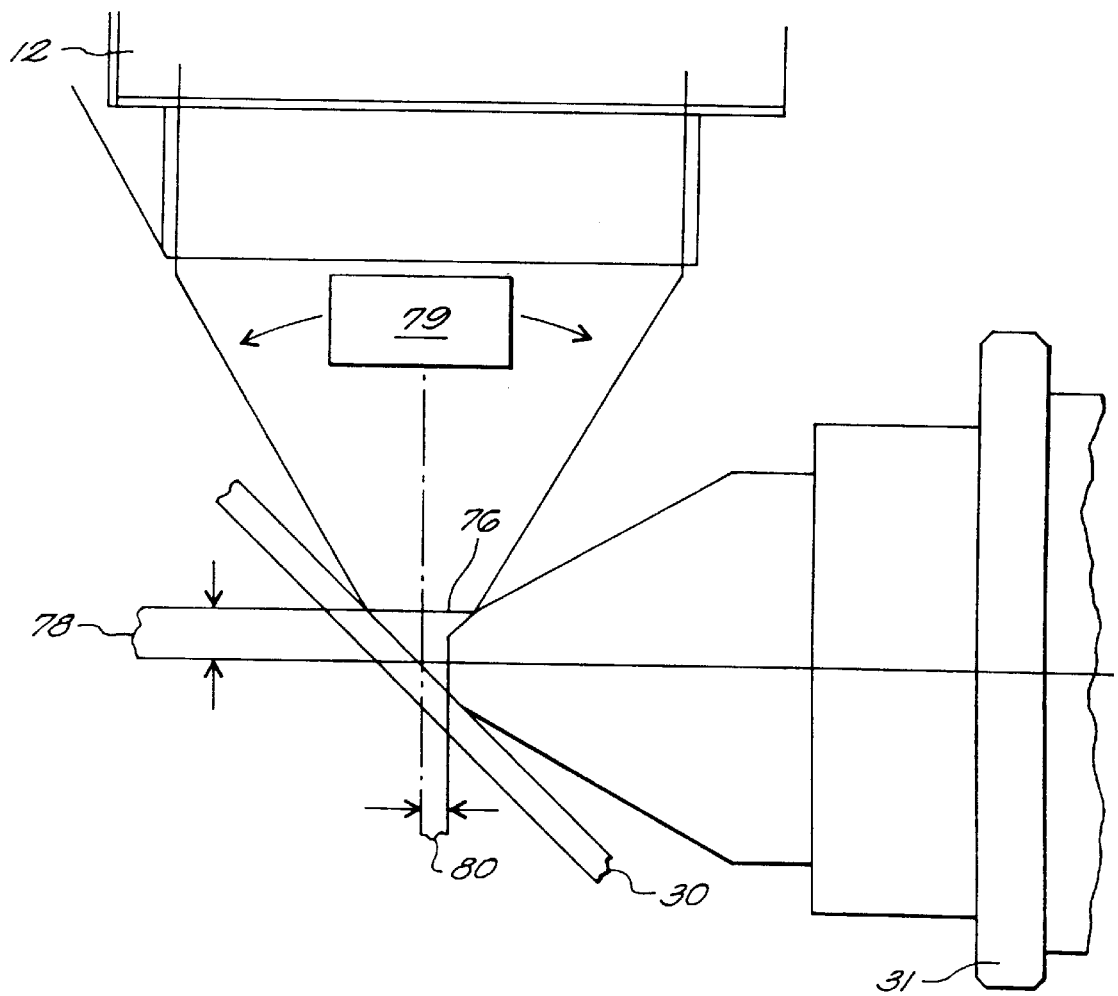
FIG. 4 is a schematic illustration of the tips of the columns and the non-tilting stage of a particle beam system similar to the particle beam system of FIG. 1.

The FIB working distance is improved. In a previous configuration with a focused ion beam oriented normal to the workpiece and an electron beam offset with respect to the normal, one could not achieve concurrent working distances that optimized the characteristics, e.g., resolution and current density, of the ion and electron beams because the work stage and the tip of the ion column and the tip of the electron column physically interfere with each other. However, as shown in FIG. 4, by offsetting the ion column 12 from the normal or third axis 17, both the ion column and the electron column 31 can get closer to the workpiece 30. For example, a 5 nm, 50 KeV focused ion beam column and an Amray electron column, model 3800, each with a 45 degree wafer view, can concurrently have more optimal working distances of about 10 mm and about 5 mm, respectively. Such concurrent optimized working distances contrast with concurrent non-optimized working distances of 16 mm with normal wafer view for the FIB column and 20 mm with a 60 degree wafer view for the electron column in a Micrion 9500IL focused ion beam system with a tilting stage.

Furthermore, as shown in FIG. 4, the focused ion beam 12 can be tiltable, i.e., the ion focusing optics, 79 can be offset from the third axis, 17.

The particle beam system according to the invention is also more stable because the system does not have a tilting stage. The system is more stable because removing the stage tilting mechanism makes the system more resistant to low frequency vibration and eliminates gravity sag.

Low frequency vibration can occur when a massive object, such as a tilting work stage assembly, is supported by two bearings and held steady with an object that behaves like a spring. Thus, a stage that is fixed so that it can not tilt, eliminates a potential source of low frequency vibration. Low frequency vibration reduction allows for increased imaging resolution.

Further when a large work stage assembly is tilted, gravity can bend some of the components of the work stage assembly and the workpiece. Such bending is termed gravity sag. Because the work stage assembly is more stable, manufacturers can include a laser interferometer to assist in the determination of the position of the workpiece. Laser interferometry requires that the laser beams used to perform the interferometry precisely maintain their spatial relationship. Consequently, the components that direct the laser beams used in the interferometer must also precisely maintain their spatial relationship. Since at least one of the components that direct the laser beams used in the interferometer is located on the work stage, the performance of a laser interferometer improves with the reduction of work stage vibration and with the reduction of gravity sag.

In addition, the configuration of the particle beam system of the present invention creates access to the workpiece for other elements. Such elements could include an optical microscope for top-down wafer navigation, a full range of gas injection nozzles including a high volume "beehive" gas concentrator (described below), or a second FIB column. One advantage of including an optical microscope for top-down wafer navigation is that it provides the focused particle beam system the ability to control the location of the surface of the workpiece 30 along the third axis 17. The system maintains such control by adjusting the position of the work stage 25 along the third axis 17 so as to maintain the surface of the workpiece in focus when viewed through the optical microscope. By controlling the position of the surface of the workpiece 30 along the third axis, the system insures that the focused particle beam 12 is interacting with a desired location on the surface of the workpiece 30.

Figure 6:
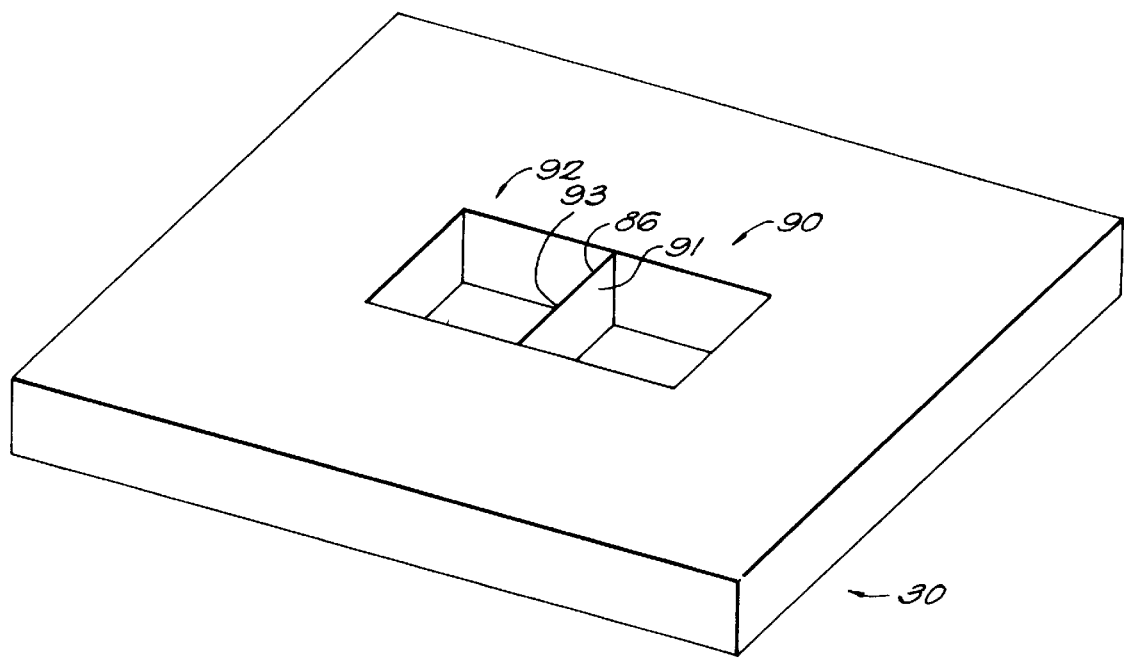
FIG. 6 is a perspective view of a transmission electron microscope (TEM) lamella prior to extraction from a workpiece that has been processed by the particle beam system of FIG. 1.

Further, the configuration of the particle beam system of the present invention makes it possible to create a transmission electron microscope (TEM) sample or lamella of relatively uniform thickness. With reference to FIGS. 1 and 6, in order to create such a lamella, the system etches a first cavity 90, translates the workpiece 30 and/or deflects the particle beam, and etches a second cavity 92 in selected proximity to the first cavity 90 so as to produce a TEM sample wall or lamella 86 separating the two cavities. The lamella can have a first side 91 facing the first cavity and a second side 93 facing the second cavity. By bombarding the second side of the TEM lamella with electrons from the electron source 31 and monitoring the change in secondary particle emission from the lamella while etching the second cavity 92, the system can monitor the thickness of the lamella 86.

As will be seen from the above description, the system 10 depicted in FIG. 1 provides a system for creating cross-sectional images to facilitate the analysis of material defects found in the wafer, and can provide process engineers with timely data without removing the wafer from the production line.

Figure 2:
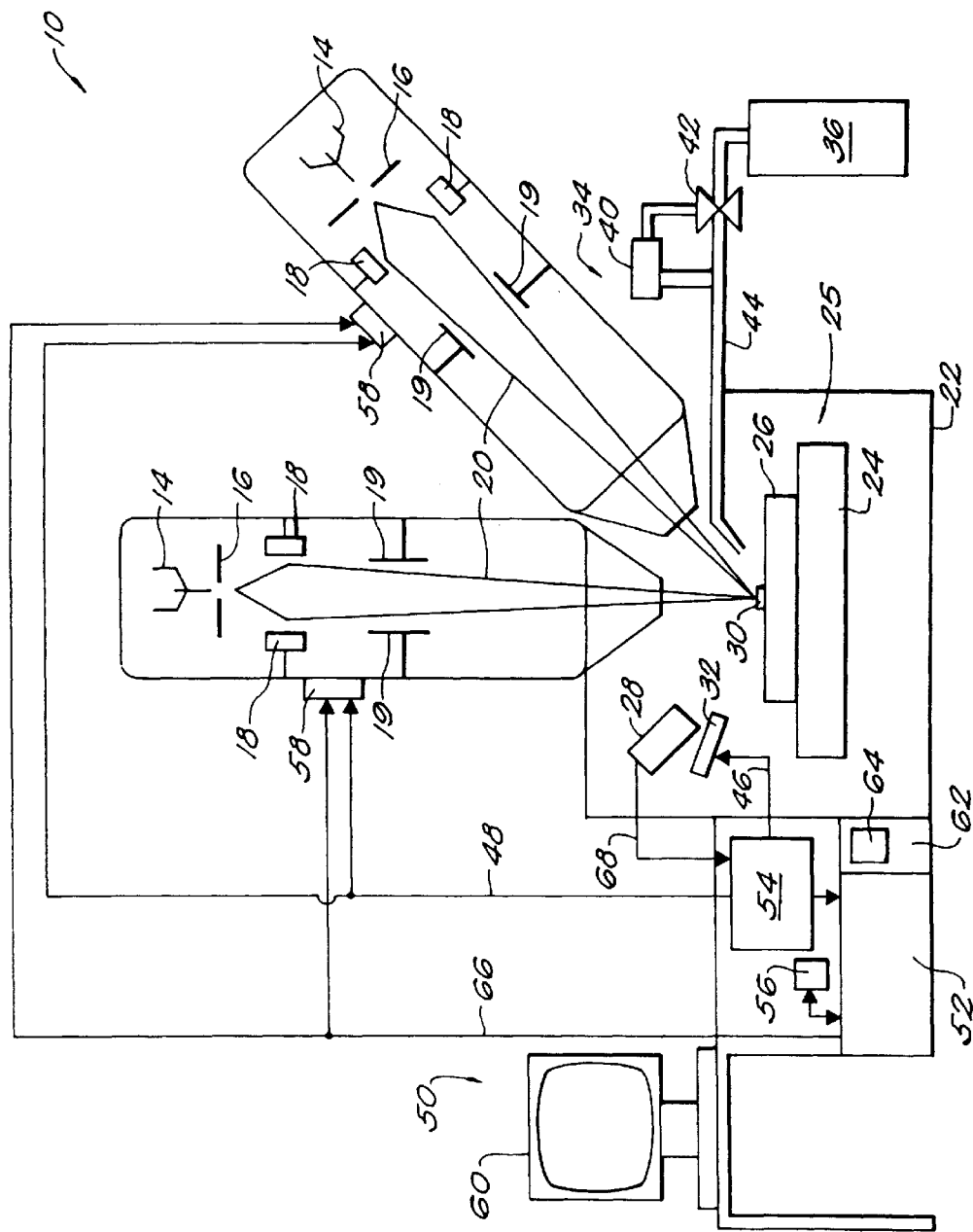
FIG. 2 is a schematic illustration of an alternative embodiment of a particle beam system according to the invention.

FIG. 2 depicts an alternative embodiment of a focused particle beam system 10 according to the invention for interacting with a workpiece 30. The system 10 of FIG. 2 includes an ion column 12, a vacuum chamber 22, an optional reactant material delivery system 34 and user control station 50. The system 10 provides a focused particle beam system that can precisely mill and image a sample 30, e.g., a wafer containing semiconductor devices. The sample 30 is seated within the vacuum chamber 22 and operated on by a particle beam generated by the column 12 to create cross-sectional images and analyze material defects found in the wafer.

The ion column 12 includes an ion source 14, an extraction electrode 16, a focusing element 18, deflection elements 19, and a focused ion beam 20. The ion column 12 sits above the vacuum chamber 22, and the vacuum chamber 22 houses a work stage assembly 25, a platform 26, a sample 30, a secondary particle detector 28 and a charge neutralization element 32. As further depicted by FIG. 2, the optional reactant material delivery system 34 includes a reservoir 36, a manometer 40, a motorized valve element 42, and delivery conduit 44. The user control station 50 includes the processor 52, a pattern recognition element 54, the memory element 56, a display element 60, a scan generator element 62, and dwell registers 64.

It will be apparent to one of ordinary skill in the art, that the system 10 depicted in FIG. 2 includes a conventional focused ion beam (FIB) system with an ion column 12 disposed above a vacuum chamber 22 that includes an optional reactant material delivery system 34 for providing reactant materials to the interior of chamber 22. As will be understood by one of ordinary skill in the art, the depicted ion column 12 is a schematic representation of one ion column suitable for practice with the invention. The depicted ion column 12 includes an ion source 14 that can be a liquid metal ion source (LMIS) such as a gallium ion source, or can be a gas field ion source (GFIS) such as a helium ion source. The ion source 14 sits above the extraction electrode 16. The extraction electrode 16 generates sufficient electric field to draw an ion stream from the ion source 14. The ion stream travels past focusing element 18, that can be conventional electro-optical lenses that focus the ion stream to the finely-focused beam 20. As further depicted, the ion column 12 includes the deflection elements 19 that can deflect the ion beam 20 to scan across the surface of the sample 30.

Similarly, the evacuation chamber 22 can be a conventional evacuation chamber that includes a work stage assembly 25 for supporting a workpiece 30. The work stage assembly 25 includes a support element 26 and a support element rotation assembly 24. The support element 26 is capable of translation along a first axis and along a second axis perpendicular to the first axis. The rotation assembly 24 is adapted for rotating the support element 26 about a third axis perpendicular to both the first axis and the second axis. Thus, the work stage assembly 25 provides control of the displacement of the workpiece being operated on by the system 10.

Similarly, evacuation chamber 22 includes a charge neutralization element 32, such as an electron gun, and further includes a secondary particle detector 28 for detecting secondary particles, such as electrons, ions, or any other particles suitable for generating an image of the workpiece. Any vacuum chamber 22 as schematically depicted herein can be practiced with the present invention, including the vacuum chamber sold with the ion beam workstation sold by Micrion Corporation of Peabody, Mass.

Similarly, the optional reactant material delivery system 34 can be any conventional reactant material delivery system suitable for delivering reactant material such as precursor gases into the interior of the vacuum chamber 22, and more particularly into the chamber 22 and proximate to the surface of the workpiece. The reactant material delivery system 34 can deliver materials to the surface of the sample 30 to enhance the etching of material from the surface or alternatively, to deposit material on the surface of the sample.

The depicted reactant material 34 includes a reservoir 36 that couples in fluid communication with the fluid delivery conduit 44 that has a distal portion formed as a nozzle for delivering reactant materials to the surface of the workpiece. The depicted reactant delivery system 34 includes a manometer 40 coupled to conduit 44 for measuring the delivery pressure within conduit 44 of any reactant materials being delivered to the surface of the workpiece 30. Manometer 40 further couples to the motorized valve element 42. The motorized valve element 44 is selectively controllable for increasing or reducing the flow of reactant materials of reservoir 36 through fluid delivery conduit 44. The arrangement of the manometer 40 and motorized valve 42 depicted in FIG. 2 forms a feedback control system wherein the manometer 40 measures the delivery pressure within conduit 44 and selectively controls the motorized valve 42 to increase or decrease the flow of reactant material to thereby maintain a select delivery pressure.

Improved gas delivery systems are provided by coupling to the distal end of a gas nozzle, a shroud-type concentrator that has an interior axial passage. The gas nozzle provides a flow of reactant material through that passage. Concurrently, a particle beam can pass through the same passage to a substrate surface being processed. This concentrator is termed a "beehive" gas concentrator.

The interior passage of the concentrator has a partially flared configuration that is understood to provide a transition from the confined fluid passage within the delivery system to the workpiece site being processed. The flared passage in one embodiment includes a frusto-conical shape, and has a least area at the upper aperture of the passage and a greatest area at an axially-opposed lower aperture. The "beehive" gas concentrator is more fully described in pending U.S. patent application Ser. No. 08/667,966, incorporated herein by reference.

The operation of the ion column 12, charge neutralization element 32, and secondary particle detector 28 are controlled by the control station 50. The depicted control station 50 includes a processor element 52 that has a scan generator element 62 that includes dwell register 64. The processor element 52 couples via a transmission path to a control element 58 coupled to the ion beam column 12. The depicted processor element 52 can be a conventional computer processor element that includes a CPU element, a program memory, a data memory, and an input/output device. One suitable processor element 52 is a IBM RSC Workstation using a Unix operating system.

As further depicted by FIG. 2, the processor element 52 can connect, via the input/output device to a scan generator element 62. In one embodiment, the scan generator element is a circuit card assembly that connects to the processor 52 via the processor input/output device. The circuit card assembly scan generator element 62 depicted in FIG. 2 includes a scan memory for storing data representative of a scanning pattern that can be implemented by system 10 for scanning ion beam 20 across the surface of the workpiece 30 to selectively mill, etch or image the surface of the workpiece 30.

The scan generator board element 62 depicted in FIG. 2 can be a conventional computer memory circuit card having sufficient memory for storing digital data information representative of locations of features of the sample that are to be processed by the particle beam system 10. Typically, a scan generator board suitable for practice with the present invention includes a series of memory locations, each of which corresponds to a location on the workpiece surface. Each memory location stores data representative of an X and Y location of the sample and preferably further has, for each X and Y location, a dwell register for storing digital data representative of a time for maintaining the particle beam on the surface of the sample at the location represented by the associated X, Y pair. Accordingly, the dwell register provides a memory location for storing a dwell time for applying the focused particle beam to the surface of the sample, to thereby allow control of the dose delivered to the workpiece.

It will be apparent to one of ordinary skill in the art of focused particle beam processes and systems that the dose delivered to a location on a workpiece surface can be understood to determine generally the depth to which material is removed from that location of the workpiece. Accordingly, the dwell time signal stored in the dwell register can also be understood as representative of a depth, or Z dimension, for the particle beam milling process. Consequently, the processor 52 that couples to such a scan generator board 62 provides a multi-dimensional milling element for generating milling signals that can control in three dimensions the etching or imaging process of the focused particle beam system.

Accordingly, the processor 52 employs the X, Y data maintained by the scan generator board 62 to generate milling signals that are transmitted via the transmission path 66 to the control element 58 of the ion column 12. In the depicted embodiment, the milling signals provide control element 58 with information for operating the deflector elements 19 to deflect the focused particle beam for scanning or rasterizing the focused particle beam across the surface of the workpiece 30, and to maintain the particle beam at the selected location for a specified dwell time to provide milling to a selected depth. The surface of the workpiece 30 generally corresponds to a two-dimensional plane that can be defined by an orthogonal pair of X and Y axes. A Z axis, that is generally understood as extending parallel to the path of the focused ion beam 20 is also generally orthogonal to the plane defined by the X and Y axis of the surface of the workpiece 30. By controlling the location of the particle beam 20 and the period of time for which the beam 20 impacts against the surface of the workpiece 30, material at selected locations of the workpiece 30 can be removed. Accordingly, the system 10 provides multidimensional control of the milling process to thereby allow the particle beam 20 to remove selected portions of the workpiece surface and form a precise geometry on the workpiece.

Although FIG. 2 depicts an ion column 12 that includes deflection elements 19 for deflecting an ion beam 20 to scan across the surface of the workpiece 30 and thereby direct the focused ion beam to a selected location on the surface of the workpiece 30, it will be apparent to one of ordinary skill in the art of focused particle beam processing that any system suitable for directing the focused particle beam to select locations of the workpiece surface can be practiced with the invention. For example, in an alternative embodiment, the platform 24 can be moved in an X, or Y space which corresponds to the X, and Y space of the milling process and the milling signals generated by the processor 52 can be provided to a stage control system that moves the stage carrying the workpiece 30 to thereby dispose a selected portion of the workpiece directly in the path of the focused particle beam to mill or image the workpiece 30. Other systems and methods for directing the particle beam can be practiced with the present invention without departing from the scope thereof.

It will be further be apparent to one of ordinary skill in the art of particle beam processes and systems that the depicted scan generator element 62 that is illustrated as a circuit card assembly of read/write computer memory can alternatively be implemented as software program code that runs on a computer platform having an accessible data memory that is configured by the program code to provide storage locations for storing the data representative of the X and Y locations as well as data representative of the dwell time. Such a modification is well within the art of one of ordinary skill and does not depart from the scope of the invention.

In this embodiment of the invention, the pattern recognition element 54 generates an image of the surface of the portion of the workpiece 30 and processes the image to determine the precise position of a feature. The position of the workpiece geometry can be represented by a coordinate signal that can define, in one embodiment, the coordinates of the periphery of the feature's footprint relative to a predefined registration point. The use of predefined registration points, which act as landmarks, is known in the art of ion beam processing for manually positioning a workpiece during a preliminary step of a focused particle beam process. Other systems and methods for initializing the coordinate system employed by the pattern recognition system 54 can be practiced with the present invention without departing from the scope thereof The system 10 depicted in FIG. 2 includes a pattern recognition system 54 that connects via transmission path 48 to the depicted ion column 12, and further couples via transmission path 68 to the secondary particle detector 28 wherein transmission path 68 carries image data to the pattern recognition element 54, and further couples via transmission path 46 to the charge neutralization element 32 wherein transmission path 46 carries a control signal to the charge neutralization element 32 for activating and deactivating the charge neutralizer 32. In the depicted embodiment, the pattern recognition element 54 further connects via a bidirectional bus to the memory element 56 that acts as a computer memory element for storing data representative of known feature presentations.

In the embodiment depicted in FIG. 2, the pattern recognition system 54 employs the focused ion beam column 12 and the secondary particle detector 28 to generate an image of the surface of the workpiece 30. Specifically, the pattern recognition element 54 generates a series of scanned control signals that are transmitted via transmission path 48 to the control element 58 of the ion column 12. The scanned control signals direct the control element 58 to scan the focused ion beam across the XY plane that defines the surface of the workpiece 30 and particularly to scan the ion beam across the portion of the surface 30 that includes the features of interest. The scanning of the ion beam 20 across the workpiece surface 30 causes the emission of secondary particles, including secondary electrons and secondary ions. The secondary particle detector 28 detects the omitted secondary particles and provides an image signal 68 to the pattern recognition system 54. The pattern recognition system 54 coordinates the image signal with the scanning signals that generate deflection signals that apply to the deflector elements 19 and correlates the image signal with the deflector signals so that changes in the detected signals are associated with particular deflection signals amplitudes corresponding to a particular location on the workpiece surface 30.

The detector 28 may be one of many types such as an electron multiplier, a micro channel plate, a secondary ion mass analyzer, a photon detector or an energy dispersive detector for detecting X-rays produced as a result of bombardment of the workpiece with an electron beam. Techniques are described herein are well known in the art of focused ion beam processing and any substitutions, modifications, additions or subtraction's to the imaging technique can be described herein is deemed to be a scope of the invention. Preferably during the imaging process the pattern recognition element 54 generates a control signal transmitted via transmission path 46 to the charge neutralization element 32. The charge neutralization element 32 depicted in FIG. 2 is an electron gun element that directs a beam of electrons towards the surface of the workpiece surface 30. The beam of electrons neutralizes a building static electric charge that arises on the workpiece surface 30 during the imaging operation. By reducing the built-up electric static charge the charge neutralizer reduces the defocusing the ion beam and deflecting of the ion beam that results from the positive surface charge on the workpiece 30 that defocuses and deflects the positively charged ion beam 20 scanning across the workpiece surface 30. Accordingly, the charge neutralizer element 32 allows the system 10 to generate more precise images of the workpiece features.

The pattern recognition element 54 stores the image signal representative of the image of the workpiece and a computer memory that forms part of the pattern recognition element 54. The pattern recognition element 54 includes a pattern recognition processor such as one manufactured and sold by the Cognex Corporation of Needham, Mass. Further, the pattern recognition system 54 can supply the image signal of the workpiece surface to the display 60 for displaying the workpiece features to the system user.

The pattern recognition element 54 analyzes the image signal stored in the recognition element computer memory. The analysis performed by the pattern recognition element 54 is described in pending U.S. patent application Ser. No. 08/635,063, herein incorporated by reference.

As will be seen from the above description, the system 10 depicted in FIG. 2 provides a system for milling and imaging a workpiece feature. The system 10 automatically identifies the location and geometry of a workpiece feature and, generates from the location and geometric information a set of milling signals that direct the focused particle beam to mill the workpiece. Thus, the system 10 can create a workpiece feature that has the precise geometry suitable for imaging and process analysis. One such operation, etching and imaging of a cross-section of a workpiece, was described above in connection with FIGS. 3A–3F.

It will thus be seen that the objects set forth above, among those made apparent from the preceding description, are officially attained. Since certain changes may be made in the above constructions without departing from the scope of the invention, it is intended that all matter contained in the above description and shown in the accompanying drawings be interpreted as illustrative and not in a limiting sense.

It is also to be understood that the following claims are intended to cover all generic and specific features of the invention described herein, and all statements of the scope of the invention which as a matter of language might be said to fall therebetween.

Having described the invention, what is claimed as new and secure by letters patent is:

1. A particle beam system for interacting with a workpiece, such system comprising:

a housing for housing the workpiece, and means for processing the workpiece contained in said housing, said means including a work stage assembly adapted a) for supporting the workpiece, b) for translating the workpiece along a first axis, c) for translating the workpiece along a second axis perpendicular to the first axis, and d) for rotating the workpiece about a third axis perpendicular to both the first axis and the second axis, said work stage assembly having a work stage axis substantially parallel to the third axis, and a first particle beam source for etching and imaging the workpiece, said first particle beam source having a first particle beam source axis oriented to form an acute angle with the third axis, such that the particle beam system can etch and can image a vertical cross-section of the workpiece without offsetting the work stage axis from the third axis.

2. A particle beam system according to claim 1 wherein said first particle beam source is oriented so that the first particle beam source axis forms an angle of greater than seven degrees and less than ninety degrees with the third axis.

3. A particle beam system of claim 1, wherein the first particle beam source is oriented such that the first particle beam axis forms an angle of about forty-five degrees with the third axis.

4. A particle beam system according to claim 1 further comprising a second particle beam source for interacting with the workpiece and located in selected proximity to said first particle beam source, the second particle beam source having a second particle beam axis oriented substantially parallel to the third axis.

5. A particle beam system according to claim 1 further comprising a second particle beam source for interacting with the workpiece and located in selected proximity to said first particle beam source, the second particle beam source having a second particle beam axis offset relative to the third axis.

6. A particle beam system according to claim 1 further comprising an electron beam source for interacting with the workpiece and located in selected proximity to the first particle beam source, the electron beam source having an electron beam axis and being oriented so that the electron beam axis is selectively offset relative to the third axis.

7. A particle beam system according to claim 6 wherein the first particle beam axis and the electron beam axis each form an angle of about forty-five degrees with the third axis, and wherein the first particle beam axis and the third axis form a first plane and the electron beam axis and the third axis form a second plane oriented substantially perpendicular to the first plane.

8. The apparatus according to claim 1 further comprising
a laser interferometer means for assisting in the determination of the position of the workpiece and located within said housing in selected proximity to said work stage assembly, said laser interferometer means including
 a laser source for directing laser radiation along a path in a first direction,
 a beam splitter located in the path of said laser radiation from said laser source and for transmitting a first part of said laser radiation along said first direction, and for reflecting a second part of said laser radiation along a second direction,
 at least one reference mirror for reflecting back to said beam splitter the first transmitted part of said laser radiation, and
 at least one test mirror for reflecting back to said beam splitter the second reflected part of said laser radiation and located on said work stage assembly,
 such that the beam splitter combines the first transmitted part and the second reflected part of the laser radiation to form interference fringes that assist in the determination of the position of the workpiece.

9. A particle beam system according to claim 1 further comprising
 a gas injection source having a gas injection nozzle located in selected proximity to the workpiece.

10. A particle beam system according to claim 1 wherein the work stage assembly rotates about the third axis more than twenty-five degrees.

11. A particle beam system according to claim 1 further comprising
 an optical microscope for interacting with the workpiece, said optical microscope having an optical microscope axis oriented substantially parallel to the third axis.

12. A particle beam system for interacting with a workpiece, said system comprising:
 a housing for housing the workpiece, and
 means for processing the workpiece contained in said housing, said means including
  a work stage assembly adapted a) for supporting a workpiece, b) for translating the workpiece along a first axis, c) for translating the workpiece along a second axis perpendicular to the first axis, and d) for rotating the workpiece about a third axis perpendicular to both the first axis and the second axis, said work stage means having a work stage axis substantially parallel to the third axis, and
  a first particle beam source for etching and imaging the workpiece supported by the work stage assembly, the first particle beam source having a first particle beam axis, the first particle beam source being tiltable from a first position, with the first particle beam axis substantially parallel to the third axis, to a second position, with the first particle beam axis forming an acute angle with the third axis,
  such that the particle beam system can etch and image a vertical cross-section of the workpiece without offsetting the work stage axis from the third axis.

13. A particle beam system for interacting with a workpiece comprising:
 a housing for housing the workpiece, and
 focused particle beam processing apparatus arranged to process the workpiece contained in said housing, said focused particle beam apparatus including
  a work stage assembly for supporting a workpiece and for orienting the workpiece in a plane, said work stage assembly having
   a support element adapted for translating the workpiece along a first axis, and for translating the workpiece along a second axis perpendicular to the first axis, the support element having a first side and a second side, and
   a positioning assembly coupled to the first side of the support element and adapted for rotating the support element and the workpiece about a third axis perpendicular to both the first axis and the second axis, such that the workpiece can be seated on the second side of the support element and translated in a plane and rotated about the third axis normal to that plane, and
  a first particle beam source for etching and imaging the workpiece supported by the work stage assembly, the first particle beam source having a first particle beam axis, the first particle beam source being tiltable from a first position with the first particle beam axis substantially parallel to the third axis, to a second position with the first particle beam axis forming an acute angle with the third axis,
  such that the particle beam system can etch and image a vertical cross-section of the workpiece without tilting the work stage axis relative to the third axis.

* * * * *